United States Patent
Su et al.

(10) Patent No.: US 11,140,024 B2
(45) Date of Patent: Oct. 5, 2021

(54) MONITORING AND MANAGEMENT METHOD FOR COMPLETE MACHINE CABINET SERVER

(71) Applicant: INSPUR ELECTRONIC INFORMATION INDUSTRY CO., LTD, Shandong (CN)

(72) Inventors: Xiao Su, Shandong (CN); Huatang Ban, Shandong (CN)

(73) Assignee: INSPUR ELECTRONIC INFORMATION INDUSTRY CO., LTD, Shandong (CN)

(*) Notice: Subject to any disclaimer, the term of this patent is extended or adjusted under 35 U.S.C. 154(b) by 666 days.

(21) Appl. No.: 15/745,111

(22) PCT Filed: Mar. 10, 2016

(86) PCT No.: PCT/CN2016/076027
§ 371 (c)(1),
(2) Date: Jan. 15, 2018

(87) PCT Pub. No.: WO2017/063332
PCT Pub. Date: Apr. 20, 2017

(65) Prior Publication Data
US 2018/0212823 A1 Jul. 26, 2018

(30) Foreign Application Priority Data
Oct. 14, 2015 (CN) .......................... 201510664281.5

(51) Int. Cl.
*G06F 1/28* (2006.01)
*G06F 1/32* (2019.01)
(Continued)

(52) U.S. Cl.
CPC ...... *H04L 41/0803* (2013.01); *G06F 11/3006* (2013.01); *G06F 11/3051* (2013.01);
(Continued)

(58) Field of Classification Search
None
See application file for complete search history.

(56) References Cited

U.S. PATENT DOCUMENTS 8,793,351 B2 * 7/2014 Renzin .................... H04L 41/08
709/220
8,843,771 B2 * 9/2014 Wang ...................... H04L 41/00
713/300

(Continued)

FOREIGN PATENT DOCUMENTS

CN 102510344 B * 11/2014 ............. H04L 41/04
CN 104331130 A 2/2015
(Continued)

OTHER PUBLICATIONS

International Search Report for PCT/CN2016/076027, dated May 25, 2016, ISA/CN.
(Continued)

*Primary Examiner* — Nicholas R Taylor
*Assistant Examiner* — Ho T Shiu
(74) *Attorney, Agent, or Firm* — Yue (Robert) Xu; Apex Attorneys at Law, LLP

(57) ABSTRACT

A method for monitoring and managing a rack server is provided. The method includes: editing, in a rack management controller RMC for monitoring and managing the rack server in a centralized manner, a configuration file based on configuration information regarding the numbers and positions of server nodes, node mid-planes, fan control boards, fans and power supplies in a rack; and automatically monitoring and managing, by the RMC, components based on the configuration file by the RMC automatically acquiring accurate numbers and positions of nodes and power supplies corresponding to the rack configuration to select a corresponding cooling-speed regulation curve. With the method, racks with different configurations can be dynamically (Continued)

monitored by modifying the configuration file including the configuration information of the rack and uploading the modified configuration file.

2 Claims, 1 Drawing Sheet

(51) Int. Cl.
    *G06F 9/445*     (2018.01)
    *H04L 12/26*     (2006.01)
    *H04L 12/911*     (2013.01)
    *H04L 12/24*     (2006.01)
    *G06F 11/30*     (2006.01)
    *G06F 11/34*     (2006.01)
    *H05K 7/20*     (2006.01)

(52) U.S. Cl.
    CPC ...... *G06F 11/3062* (2013.01); *G06F 11/3495* (2013.01); *H04L 41/0843* (2013.01); *H04L 41/0853* (2013.01); *H05K 7/20736* (2013.01); *H05K 7/20836* (2013.01); *H04L 41/0866* (2013.01)

(56) References Cited

U.S. PATENT DOCUMENTS

| | | | |
|---|---|---|---|
| 2013/0179718 A1 | 7/2013 | Jau | |
| 2014/0074261 A1* | 3/2014 | Wang | G06F 1/00 700/90 |
| 2016/0026459 A1* | 1/2016 | Yang | G06F 8/654 717/171 |

FOREIGN PATENT DOCUMENTS

| | | | |
|---|---|---|---|
| CN | 104407680 A | | 3/2015 |
| CN | 104615447 A | * | 5/2015 |
| CN | 104615447 A | | 5/2015 |
| CN | 104675737 A | | 6/2015 |
| CN | 105302690 A | | 2/2016 |

OTHER PUBLICATIONS

The 1st Office Action regarding Chinese Patent Application No. CN201510664281.5, dated May 5, 2016. English Translation Provided by http://globaldossier.uspto.gov.

The 2nd Office Action regarding Chinese Patent Application No. CN201510664281.5, dated Nov. 28, 2016. English Translation Provided by http://globaldossier.uspto.gov.

* cited by examiner

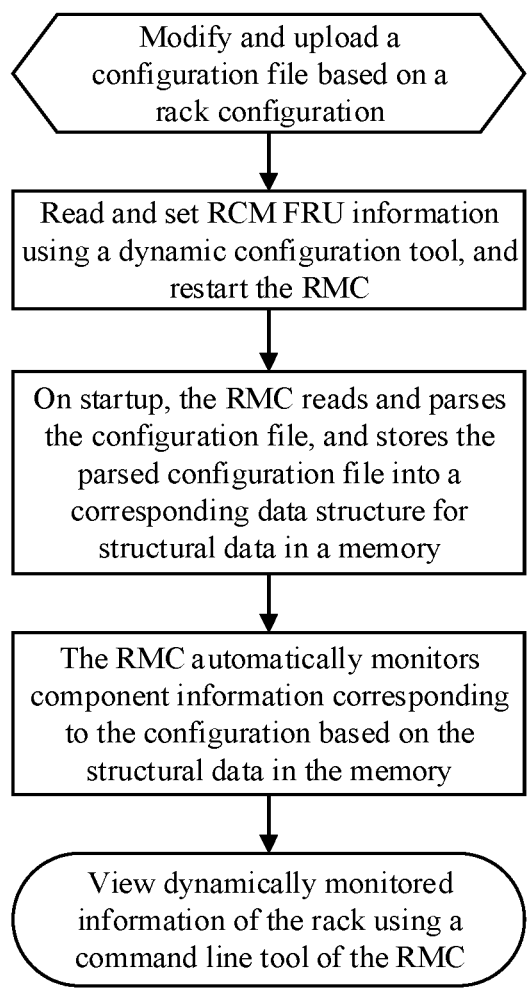

MONITORING AND MANAGEMENT METHOD FOR COMPLETE MACHINE CABINET SERVER

This application is the national phase of International Application No. PCT/CN2016/076027, titled "MONITORING AND MANAGEMENT METHOD FOR COMPLETE MACHINE CABINET SERVER", filed on Mar. 10, 2016, which claims the priority to Chinese Patent Application No. 201510664281.5, titled "MONITORING AND MANAGEMENT METHOD FOR COMPLETE MACHINE CABINET SERVER", filed with the Chinese State Intellectual Property Office on Oct. 14, 2015, both of which are incorporated herein by reference in their entireties.

FIELD

The present disclosure relates to the technical field of server rack monitoring and management, and in particular to a method for monitoring and managing a rack server.

BACKGROUND

With the development of computer technologies, rack servers are more and more widely used in actual applications. Dozens of server nodes are integrated in a rack, and are managed and monitored in a centralized manner by a RMC (Rack Management Controller) responsible for monitoring and managing the rack. The monitored and managed components include the server node, a node mid-plane, a PSU, a fan control board, a fan and the like. Generally, the numbers of nodes, fans, PSUs and the like integrated in a rack vary according to the power capability and the service form of a server room. Therefore, the RMC needs to be customized in advance based on configuration information of the rack, where the configuration information of the rack is predetermined, and the RMC is customized in advance for each configuration.

Since there are various types of configurations and various combinations of the configurations, the above method involving customization is inadequate in meeting requirement for rapid customization. In addition, variations in the requirement are coped with by re-modifying the RMC, which is complicated and inefficient. Further, with the increase in customization, the number of RMC versions is inevitably increased, which causes great inconvenience to subsequent version maintenance.

Therefore, it is an issue to be solved by designers and developers to develop a monitoring and management method for the RMC, with which a configuration can be dynamically generated based on hardware information of a rack without modifying RMC codes.

Technical Issue

A technical issue to be solved by the present disclosure is to provide a method for monitoring and managing a rack server, which can be flexibly adapted to different configuration combinations of hardware of the rack server. When the configuration is changed, it is only necessary to edit a new configuration file based on new configuration information, and upload the new configuration file. A corresponding configuration is automatically generated by the RMC using a dynamic configuration tool. In this case, it is unnecessary to maintain multiple RMC versions, thereby greatly reducing the difficulty in development and maintenance.

Solution to the Technical Issue

Technical Solution

The following technical solution is provided according to the present disclosure.

A method for monitoring and managing a rack server is provided according to the disclosure. The method includes: editing, in a rack management controller RMC for monitoring and managing the rack server in a centralized manner, a configuration file based on configuration information regarding the numbers and positions of server nodes, node mid-planes, fan control boards, fans and power supplies in a rack; and automatically monitoring and managing, by the RMC, components based on the configuration file by the RMC automatically acquiring accurate numbers and positions of nodes and power supplies corresponding to the rack configuration to select a corresponding cooling-speed regulation curve.

The method further includes: in a case that the rack configuration is changed, editing a configuration file in a certain format for the changed rack configuration; uploading the configuration file to the RMC via a SCP service or a RZSZ; reading and parsing, by the RMC, the configuration file, and storing, by the RMC, configuration information acquired by parsing the configuration file in a memory; and automatically monitoring and managing, by the RMC, the rack, and displaying, by the RMC based on the changed rack configuration, component information corresponding to the configuration. In this case, it is unnecessary to modify software of the RMC or to develop different RMC FW versions for different rack configurations or different customer requirements, and only one RMC version is provided. As a result, the workload for developing the RMC is decreased, upgrade and maintenance of software versions are facilitated, and time for developing, testing and maintaining the software is saved, thus the efficiency is significantly improved.

The method includes:

1) defining variables in hardware configuration of the rack, and writing the configuration information into the configuration file based on an actual rack configuration, where the variables includes the number of nodes, positions of nodes in the rack, the number of node mid-planes, positions of the node mid-planes, the number of fan control boards, positions of the fan control boards, the number of fans, the number of PSUs, positions of the PSUs, the adopted fan speed regulation policy, and FRU information identifying the configuration;

2) uploading the configuration file to the RMC via the SCP service or the RZSZ, setting FRU to be FRU information read from the configuration file using a configuration tool, and restarting the RMC;

3) reading and parsing, by the RMC on startup, the configuration file to acquire items of the configuration information in the configuration file, and storing, by the RMC, the items of the configuration information acquired by parsing the configuration file into a corresponding data structure for structural data in a memory, where an I2C bus at which each node mid-plane is located, an I2C address of the node mid-plane, the number of nodes connected to the node mid-plane, the number of fans connected to a FCB on a layer on which the node mid-plane is located, an I2C bus connected to a power supply and a slave address are defined in detail in the data structure;

4) automatically monitoring, by the RMC, component information corresponding to the configuration, and displaying, by the RMC, the component information using a command line tool, based on the structural data in the memory, where the component information includes a node intake vent temperature, a node power consumption, a PSU power consumption, and the like; and 5) modifying and re-uploading the configuration file, and performing setting in a case that the rack configuration is changed, for example, the number of nodes or the number of fans is reduced, to perform automatic management and automatic monitoring without modifying RMC codes.

Advantageous Effect of the Present Disclosure

Advantageous Effect

The present disclosure has the following advantageous effect.

With the method according to the present disclosure, racks with different configurations can be dynamically monitored by modifying the configuration file including the configuration information of the rack and uploading the modified configuration file. It is unnecessary to develop a RMC separately for each configuration in a customized manner, which greatly reduces the difficulty in software development and maintenance and improves efficiency. In addition, the method is easy to operate in practical applications, thus reliability and maintainability of the rack are improved. Therefore, the method has a high application value.

BRIEF DESCRIPTION OF THE DRAWINGS

Description of the Drawings

FIG. 1 is a flow chart of a method according to the present disclosure.

DETAILED DESCRIPTION OF THE EMBODIMENTS

The Embodiments of the Present Disclosure

Hereinafter, the present disclosure will be further described in accordance with drawings and in conjunction with specific embodiments.

First Embodiment

A method for monitoring and managing a rack server is provided according to the disclosure. In the method, a configuration file is edited in a rack management controller RMC for monitoring and managing the rack server in a centralized manner based on configuration information regarding the numbers and positions of server nodes, node mid-planes, fan control boards, fans and power supplies in a rack, and the RMC automatically monitors and manages components based on the configuration file by automatically acquiring accurate numbers and positions of nodes and power supplies corresponding to the rack configuration to select a corresponding cooling-speed regulation curve.

Second Embodiment

This embodiment is based the first embodiment. In this embodiment, in a case that the rack configuration is changed, it is unnecessary to modify software of the RMC. A configuration file is edited in a certain format for the changed rack configuration. The configuration file is uploaded to the RMC via a SCP service or a RZSZ. The RMC reads and parses the configuration file, and stores configuration information acquired by parsing the configuration file in a memory. The RMC automatically monitors and manages the rack, and displays, based on the changed rack configuration, component information corresponding to the configuration. In this case, it is unnecessary to develop different RMC FW versions for different rack configurations or different customer requirements, and only one RMC version is provided. As a result, the workload for developing the RMC is decreased, upgrade and maintenance of software versions are facilitated, and time for developing, testing and maintaining the software is saved, thus the efficiency is significantly improved.

Third Embodiment

Reference is made to FIG. 1. On the basis of the first embodiment or the second embodiment, the method according to this embodiment includes the following steps 1) to 5).

In step 1), variables in hardware configuration of the rack are defined, and the configuration information is written into the configuration file based on an actual rack configuration, where the variables includes the number of nodes, positions of nodes in the rack, the number of node mid-planes, positions of the node mid-planes, the number of fan control boards, positions of the fan control boards, the number of fans, the number of PSUs, positions of the PSUs, the adopted fan speed regulation policy, and FRU information identifying the configuration.

In step 2), the configuration file is uploaded to the RMC via the SCP service or the RZSZ, FRU is set to be FRU information read from the configuration file using a configuration tool, and the RMC is restarted.

In step 3), on startup, the RMC reads and parses the configuration file to acquire items of the configuration information in the configuration file, and stores the items of the configuration information acquired by parsing the configuration file into a corresponding data structure for structural data in a memory. An I2C bus at which each node mid-plane is located, an I2C address of the node mid-plane, the number of nodes connected to the node mid-plane, the number of fans connected to a FCB on a layer on which the node mid-plane is located, an I2C bus connected to a power supply and a slave address are defined in detail in the data structure.

In step 4), the RMC automatically monitors component information corresponding to the configuration, and displays the component information using a command line tool based on the structural data in the memory. The component information includes a node intake vent temperature, a node power consumption, a PSU power consumption, and the like.

In step 5), the configuration file is modified and re-uploaded, and setting is performed in a case that the rack configuration is changed, for example, the number of nodes or the number of fans is reduced, to perform automatic management and automatic monitoring without modifying RMC codes.

The above embodiments are intended to be illustrative only, and are not intend to limit the present disclosure. Various changes and variations can be made by those skilled in the art without departing from the spirit and scope of the present disclosure. Therefore, all equivalent technical solutions are also fall within the scope of the present disclosure. The scope of protection of the present disclosure is defined by the claims.

The invention claimed is:

1. A method for monitoring and managing a rack server comprising:

editing, for a rack management controller RMC for monitoring and managing the rack server in a centralized manner, a configuration file based on configuration information regarding the numbers and positions of server nodes, node mid-planes, fan control boards, fans and power supplies in a rack, comprising:

defining variables for hardware configuration of the rack, and writing the variables into the configuration file as the configuration information based on an actual rack configuration, and uploading the configuration file to the RMC via an SCP command or RZ and SZ commands, setting FRU to be FRU information read from the configuration file using a configuration tool, and restarting the RMC; and automatically monitoring and managing, by the RMC, components based on the configuration file by the RMC automatically acquiring accurate numbers and positions of nodes and power supplies corresponding to the rack configuration to select a corresponding cooling-speed regulation curve, comprising:

reading and parsing, by the RMC on startup, the configuration file to acquire items of the configuration information in the configuration file, and storing, by the RMC, the items of the configuration information acquired by parsing the configuration file into a corresponding data structure for structural data in a memory, wherein an I2C bus at which each node mid-plane is located, an I2C address of the node mid-plane, the number of nodes connected to the node mid-plane, the number of fans connected to a FCB on a layer on which the node mid-plane is located, an I2C bus connected to a power supply and a slave address are defined in detail in the data structure, and automatically monitoring, by the RMC, component information corresponding to the configuration, and displaying, by the RMC, the component information using a command line tool, based on the structural data in the memory, wherein in a case that the rack configuration is changed, the configuration file is modified and uploaded, to cause RMC to automatically monitor and manage components based on the modified configuration file.

2. The method for monitoring and managing a rack server according to claim 1, further comprising, in a case that the rack configuration is changed, modifying the configuration file in a certain format for the changed rack configuration;

uploading the configuration file to the RMC via the SCP command or the RZ and SZ commands;

reading and parsing, by the RMC, the configuration file, and storing, by the RMC, configuration information acquired by parsing the configuration file in a memory; and automatically monitoring and managing, by the RMC, the rack, and displaying, by the RMC based on the changed rack configuration, component information corresponding to the configuration.

* * * * *